United States Patent
Lim et al.

(10) Patent No.: US 9,402,118 B2
(45) Date of Patent: Jul. 26, 2016

(54) HOUSING AND METHOD TO CONTROL SOLDER CREEP ON HOUSING

(71) Applicant: Knowles Electronics, LLC, Itasca, IL (US)

(72) Inventors: Tony K. Lim, Naperville, IL (US); Kurt B. Friel, Sycamore, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 13/949,337

(22) Filed: Jul. 24, 2013

(65) Prior Publication Data

US 2014/0037124 A1    Feb. 6, 2014

Related U.S. Application Data

(60) Provisional application No. 61/676,378, filed on Jul. 27, 2012.

(51) Int. Cl.
| | |
|---|---|
| *H04R 1/02* | (2006.01) |
| *H05K 1/18* | (2006.01) |
| *H04R 1/08* | (2006.01) |
| *H05K 3/34* | (2006.01) |

(52) U.S. Cl.
CPC .................. *H04R 1/02* (2013.01); *H04R 1/083* (2013.01); *H05K 1/18* (2013.01); *H05K 3/3426* (2013.01); *H04R 2201/003* (2013.01); *H05K 2201/10083* (2013.01); *H05K 2201/10371* (2013.01); *Y02P 70/613* (2015.11)

(58) Field of Classification Search
CPC .... H04R 1/02; H04R 1/083; H04R 2201/003; H04R 2201/02; H05K 1/18; H05K 3/3426; H05K 2201/10083; H05K 2201/10372; H05K 5/00; H05K 5/0034; H05K 5/0243; H05K 5/03; H05K 5/04; H05K 5/06; H05K 5/0095
USPC .................. 381/345, 355, 361, 369, 386, 395
See application file for complete search history.

(56) References Cited

U.S. PATENT DOCUMENTS

| | | | |
|---|---|---|---|
| 5,740,261 | A | 4/1998 | Loeppert |
| 6,535,460 | B2 | 3/2003 | Loeppert |
| 6,552,469 | B1 | 4/2003 | Pederson |
| 6,781,231 | B2 | 8/2004 | Minervini |
| 6,847,090 | B2 | 1/2005 | Loeppert |
| 7,145,230 | B2 * | 12/2006 | Hosoya ..................... 257/708 |

(Continued)

FOREIGN PATENT DOCUMENTS

| | | |
|---|---|---|
| JP | 2009-038077 A | 2/2009 |
| WO | 2012-088688 A1 | 7/2012 |

OTHER PUBLICATIONS

International Search Report and Written Opinion for PCT/US2013/051975, dated Nov. 18, 2013, 48 pages.

*Primary Examiner* — Ahmad F Matar
*Assistant Examiner* — Sabrina Diaz
(74) *Attorney, Agent, or Firm* — Foley & Lardner LLP

(57) ABSTRACT

An acoustic device includes a substrate, a substrate cover, and a plurality of electrical and acoustic components. The substrate cover is disposed on the substrate and the plurality of electrical and acoustic components are disposed on the substrate and under the substrate cover. The substrate cover is constructed of a base metal and the substrate cover comprises a partially plating. The partial plating is arranged so as to prevent solder creep along a surface of the substrate cover.

15 Claims, 3 Drawing Sheets

(56) References Cited

U.S. PATENT DOCUMENTS

| | | |
|---|---|---|
| 7,166,910 B2 | 1/2007 | Minervini |
| 7,190,038 B2 | 3/2007 | Dehe et al. |
| 7,242,089 B2 | 7/2007 | Minervini |
| 7,297,567 B2 | 11/2007 | Loeppert |
| 7,381,589 B2 | 6/2008 | Minervini |
| 7,382,048 B2 | 6/2008 | Minervini |
| 7,434,305 B2 | 10/2008 | Minervini |
| 7,439,616 B2 | 10/2008 | Minervini |
| 7,473,572 B2 | 1/2009 | Dehe et al. |
| 7,501,703 B2 | 3/2009 | Minervini |
| 7,537,964 B2 | 5/2009 | Minervini |
| 7,633,156 B2 | 12/2009 | Minervini |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 8,018,049 B2 | 9/2011 | Minervini |
| 8,121,331 B2 | 2/2012 | Minervini |
| 8,170,244 B2 | 5/2012 | Ryan |
| 8,358,004 B2 | 1/2013 | Minervini |
| 8,450,817 B2 | 5/2013 | Minervini |
| 8,457,332 B2 | 6/2013 | Loeppert |
| 8,526,665 B2 | 9/2013 | Lutz |
| 8,594,347 B2 | 11/2013 | Ryan |
| 8,617,934 B1 | 12/2013 | Minervini |
| 8,623,709 B1 | 1/2014 | Minervini |
| 8,623,710 B1 | 1/2014 | Minervini |
| 8,624,384 B1 | 1/2014 | Minervini |
| 8,624,385 B1 | 1/2014 | Minervini |
| 8,624,386 B1 | 1/2014 | Minervini |
| 8,624,387 B1 | 1/2014 | Minervini |
| 8,629,005 B1 | 1/2014 | Minervini |
| 8,629,551 B1 | 1/2014 | Minervini |
| 8,629,552 B1 | 1/2014 | Minervini |
| 8,633,064 B1 | 1/2014 | Minervini |
| 8,652,883 B1 | 2/2014 | Minervini |
| 8,704,360 B1 | 4/2014 | Minervini |
| 8,765,530 B1 | 7/2014 | Minervini |
| 8,781,140 B2 | 7/2014 | Lautenschlager |
| 8,791,531 B2 | 7/2014 | Loeppert |
| 8,879,767 B2 | 11/2014 | Wickstrom |
| 8,969,980 B2 | 3/2015 | Lee |
| 8,987,030 B2 | 3/2015 | Loeppert |
| 8,995,694 B2 | 3/2015 | Vos |
| 9,006,880 B1 | 4/2015 | Minervini |
| 9,023,689 B1 | 5/2015 | Minervini |
| 9,024,432 B1 | 5/2015 | Minervini |
| 9,040,360 B1 | 5/2015 | Minervini |
| 9,051,171 B1 | 6/2015 | Minervini |
| 9,061,893 B1 | 6/2015 | Minervini |
| 9,067,780 B1 | 6/2015 | Minervini |
| 9,078,063 B2 | 7/2015 | Loeppert |
| 9,096,423 B1 | 8/2015 | Minervini |
| 9,133,020 B1 | 9/2015 | Minervini |
| 9,137,595 B2 | 9/2015 | Lee |
| 9,139,421 B1 | 9/2015 | Minervini |
| 9,139,422 B1 | 9/2015 | Minervini |
| 9,148,731 B1 | 9/2015 | Minervini |
| 9,150,409 B1 | 10/2015 | Minervini |
| 2004/0253760 A1 | 12/2004 | Zhang |
| 2005/0023661 A1* | 2/2005 | Matsubara et al. ........... 257/678 |
| 2005/0207605 A1 | 9/2005 | Dehe et al. |
| 2005/0258516 A1 | 11/2005 | Hong et al. |
| 2006/0115323 A1 | 6/2006 | Coppeta et al. |
| 2007/0215962 A1 | 9/2007 | Minervini |
| 2007/0278501 A1 | 12/2007 | Macpherson et al. |
| 2008/0142475 A1 | 6/2008 | Loeppert |
| 2008/0175425 A1 | 7/2008 | Roberts et al. |
| 2008/0217709 A1 | 9/2008 | Minervini |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2011/0079888 A1* | 4/2011 | Bathan et al. ................ 257/676 |
| 2011/0156242 A1 | 6/2011 | Sakaguchi et al. |
| 2011/0255850 A1* | 10/2011 | Dinh et al. .................... 396/176 |
| 2012/0039499 A1 | 2/2012 | Ryan |
| 2012/0250897 A1* | 10/2012 | Michel et al. ................. 381/111 |
| 2012/0263978 A1* | 10/2012 | Wang ..................... H01G 11/74 |
| | | 429/7 |
| 2013/0108074 A1 | 5/2013 | Reining |
| 2013/0177192 A1 | 7/2013 | Abry |
| 2014/0037115 A1 | 2/2014 | Vos |
| 2014/0037120 A1 | 2/2014 | Lim |
| 2014/0064546 A1 | 3/2014 | Szczech |
| 2014/0133686 A1 | 5/2014 | Lee |
| 2014/0177113 A1 | 6/2014 | Gueorguiev |
| 2014/0291783 A1 | 10/2014 | Talag |
| 2014/0291784 A1 | 10/2014 | Conklin |
| 2014/0294209 A1 | 10/2014 | Szczech |
| 2014/0321687 A1 | 10/2014 | Friel |
| 2015/0117681 A1 | 4/2015 | Watson |
| 2015/0139428 A1 | 5/2015 | Reining |
| 2015/0166335 A1 | 6/2015 | Loeppert |
| 2015/0172825 A1 | 6/2015 | Lim |
| 2015/0195659 A1 | 7/2015 | Szczech |
| 2015/0208165 A1 | 7/2015 | Volk |
| 2015/0251898 A1 | 9/2015 | Vos |

* cited by examiner

HOUSING AND METHOD TO CONTROL SOLDER CREEP ON HOUSING

CROSS REFERENCE TO RELATED APPLICATION

This patent claims benefit under 35 U.S.C. §119 (e) to U.S. Provisional Application No. 61/676,378 entitled "Housing and Method to Control Solder Creep on Housing" filed Jul. 27, 2012, the content of which is incorporated herein by reference in its entirety.

TECHNICAL FIELD

This application relates to the acoustic devices and more specifically to the housings of these devices.

BACKGROUND OF THE INVENTION

MicroElectroMechanical System (MEMS) devices include microphones and speakers to mention two examples. In the case of a MEMS microphone, sound energy enters through a sound port and vibrates a diaphragm. This action creates a corresponding change in electrical potential (voltage) between the diaphragm and a back plate disposed near the diaphragm. This voltage represents the sound energy that has been received. Typically, the voltage is then transmitted to an electric circuit (e.g., an integrated circuit such as an application specific integrated circuit (ASIC)). Further processing of the signal may be performed by the electrical circuit. For instance, amplification or filtering functions may be performed on the signal at the integrated circuit.

The internal devices (e.g., integrated circuit, MEMS device) of a microphone are disposed within a housing or assembly. For example, these devices may be attached to a base and covered with a lid. In other words, a cavity is formed by the lid and the internal devices (e.g., an integrated circuit, MEMS device) are disposed on the base within the cavity.

In many examples, the lid is coupled to the base of the acoustic device with solder. In fact, the lid may be attached to the base by solder on both on the inside portion (in the cavity and exposed to the MEMS device and the integrated circuit) and on the exterior of the device (exposed to the external environment).

In order that the solder can be attached to the lid (and thus make the connection to the base), the entire lid is typically plated in gold (or some other appropriate metal) and then the attachment between the lid and base is made. However, in many situations after the attachment is made the device (including the solder) is re-heated. In these circumstances, the solder will melt and continues to interact with the plating, and "creeps" up the lid or flows. As this happens within the cavity, some solder can be discharged from the lid and cause failure to the MEMS device or integrated circuit within the cavity. On the outside of the lid, the "creeping" solder can continue to flow up the lid onto the surface of the lid and this will interfere with subsequent gasketing of the microphone.

BRIEF DESCRIPTION OF THE DRAWINGS

For a more complete understanding of the disclosure, reference should be made to the following detailed description and accompanying drawings wherein.

Figure 1:
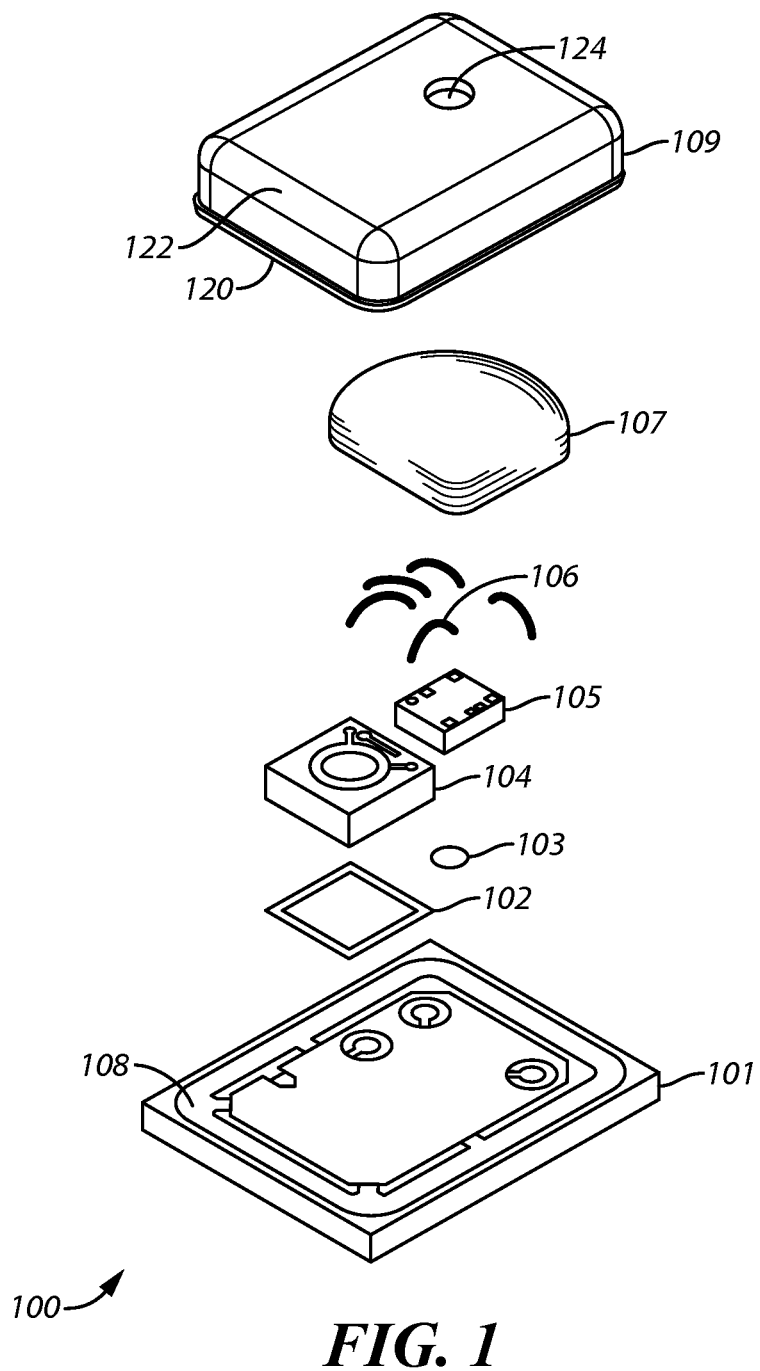
FIG. 1 comprises a perspective and exploded view of a microphone assembly according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The approaches presented herein control solder creep or flow across a lid or across other locations of a microphone assembly. In one example, the lid (or housing) is at least partially constructed of a base metal (such as brass) and is referred to herein as a "metal can." The metal can is only partially plated. By "plated", it is meant that a layer or coating of another metal is attached to the surface of the base metal forming the lid. Since the metal can is not fully plated, control of the solder (or some other conductive fusion material) that can potentially creep up or flow across the metal can is achieved. Unwanted joint material (e.g., solder) is prevented from entering areas or volumes that are to be kept free of this unwanted material thereby preventing damage to internal components of microphones or other acoustic devices.

The approaches described herein are not subject to process variability, particular thicknesses of the plating, reflow profiles, and customer reflow processes. In still another advantage, manufacturing processes do not have to inspect manufactured devices for solder creep thereby reducing manufacturing costs.

In yet another advantage, the cost of microphone assemblies is still reduced because the whole metal can or housing need not be plated (with an expensive material such as gold). This allows both the amount of plating to be reduced and the can to be constructed of a cheaper material that may also have other advantageous properties. To take one specific example, the present approaches allow a reduction in the amount of gold plating used and this facilitates the increased usage of stainless steel for the base material of the lid since there is no need to fully plate the lid. In one aspect, stainless steel has several advantages over brass. For example, use of stainless steel allows the formation of a much "squarer" lid (e.g., having sharp, well-defined corners) than brass. Other advantages may also exist.

In many of these embodiments, solder creeping is controlled to a required height of a lid, while still providing sufficient metallic bonding between metal can and a base (e.g., a FR4-constructed base). The partial plating can be achieved via an automation process that is performed at the plating house or manufacturer.

In many of these embodiments, an acoustic device includes a substrate, a substrate cover, and a plurality of electrical and acoustic components. The substrate cover is disposed on the substrate and the plurality of electrical and acoustic components are disposed on the substrate and under the substrate cover. The substrate cover is constructed of a base metal and the substrate cover comprises a partially plating. The partial plating is arranged so as to prevent solder creep along a surface of the substrate cover.

In some examples, the base metal is brass. In other examples, the base metal is stainless steel. In some examples, the partial plating is gold. In other examples, the partial plating is nickel.

In some aspects, the partial plating is effective to prevent solder creep to a predetermined height of the substrate cover. In other aspects, the partial plating comprises approximately ¼ to ⅓ of the area of the cover.

In some examples, the surface of the substrate cover comprises an inner surface of the substrate cover. In other examples, the surface of the substrate cover comprises an outer surface of the substrate cover.

Figure 2:
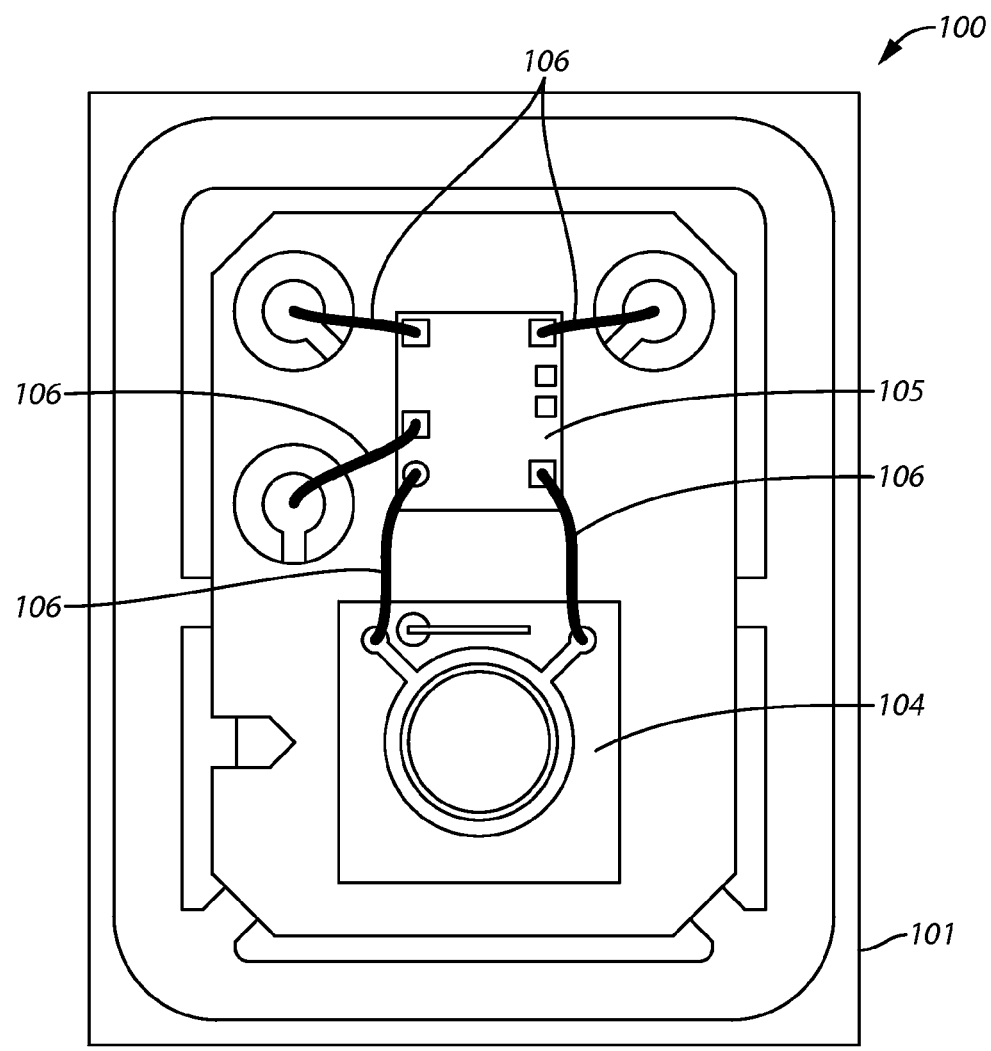
FIG. 2 comprises a top view of the microphone assembly according to various embodiments of the present invention.
Figure 3:
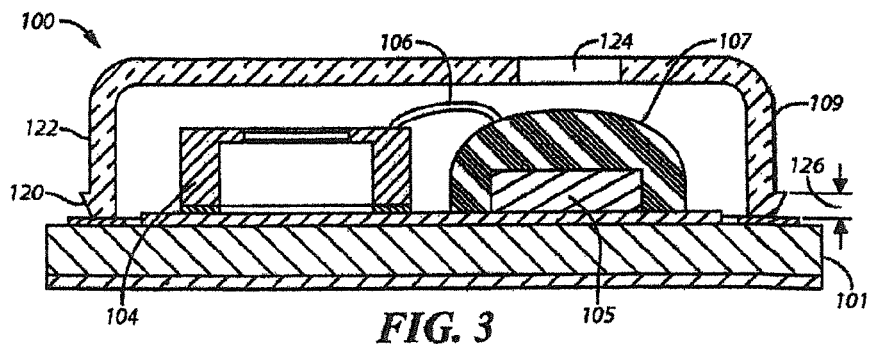
FIG. 3 comprises a side cutaway view of the microphone assembly of FIGS. 1-2 according to various embodiments of the present invention.

Referring now to FIGS. 1, 2, and 3, one example of a microphone assembly 100 with selective plating is described. The assembly 100 includes a base 101, epoxy attachment 102, epoxy attachment 103, a microelectromechanical system (MEMS) device 104, an integrated circuit 105, wires 106, encapsulation 107, solder paste 108, and a lid 109.

The base 101 is a substrate on which the lid and other components rest. In one example, the base 101 is constructed of an FR-4 material. Other examples of materials may also be used. The epoxy attachment 102 and the epoxy attachment 103 are adhesives that attach the MEMS device 104 and the integrated circuit 105 to the base 101.

The MEMS device 104 receives sound energy and converts the sound energy into electrical energy. In that respect, the MEMS device 104 may include a diaphragm and a back plate. Sound energy causes movement of the diaphragm and this varies the electrical potential between the diaphragm and the back plate. The current or voltage that is produced represents the sound energy that has been received by the MEMS apparatus 104.

The integrated circuit 105 is any kind of integrated circuit that performs any kind of processing function. In one example, the integrated circuit 105 is a buffer or an amplifier. Other examples of integrated circuits are possible. The wires 106 are connections that couple electrical components together.

The encapsulation 107 is a material (e.g., silicone-based epoxy) that covers the integrated circuit 105. The purpose of the encapsulation 107 is to provide environmental protection for the integrated circuit 105.

The solder paste 108 is paste of solder. The purpose of the solder paste is to hold the lid and the base together. The solder paste, in one aspect, is on the inside and outside of the lid. Other examples of conductive fusion materials are possible.

The lid 109 is a metal cover. The lid 109 is attached to the base 101 by the solder paste 108. The lid 109 is constructed of metal (e.g., brass or stainless steel). The lid has a plated section 120 and a non-plated section 122. The plated section 120 is a brass base that is plated with gold. In other examples, nickel, Paladium-Nickel-Gold, or tin plating can also be used. Solder will run in the plated section 120 but will not attach to the non-plated section 122. The lid includes a port 124 through which the sound energy enters the assembly 100.

In one example, the plated area (as shown by the dimension labeled 126 in the figures) is approximately ¼ to ⅓ the total height of the metal can. The height of the metal can may vary depending upon the height of the package in which the can is placed. In one example, the base is around 0.35 mm and the total can is approximately 1 to 1.5 mm in height. Reduced dimensions are possible. It will be understood that the approaches may be used with both top port and bottom port devices.

Figure 4:
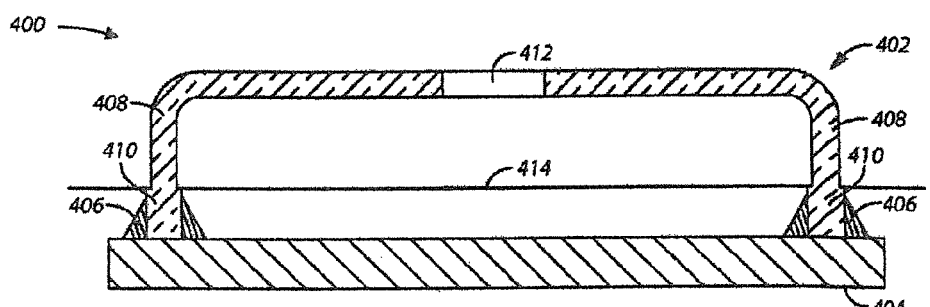
FIG. 4 comprises a side cutaway view of a microphone assembly according to various embodiments of the present invention.
Figure 5:
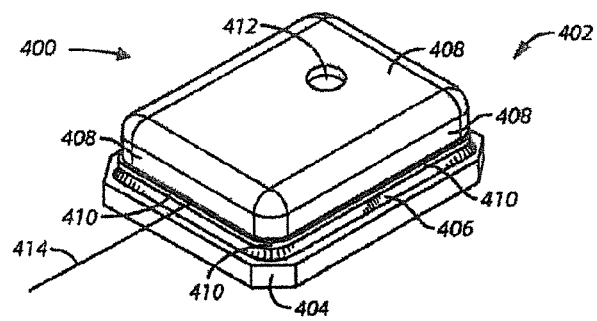
FIG. 5 comprises a perspective view of the assembly of FIG. 4 according to various embodiments of the present invention.

Referring now to FIGS. 4 and 5, another example of a microphone assembly 400 with selective plating is described. The assembly 400 includes a lid 402 and a base 404. The lid 402 forms a metal can that is attached to the base 404. For simplicity, the internal components (e.g., MEMS device, integrated circuit) within the metal can are not shown in FIG. 4.

In this example, the lid or can 402 is a metal cover. The lid 402 is attached to the base 404 by the solder paste 406. The lid 402 is constructed of metal (e.g., brass or stainless steel to mention two examples). The lid 402 includes a non-plated section 408 and a plated section 410. The plated section 410 in one aspect is a brass base that is plated with gold. In another example, nickel can be used. Solder will run in the plated section 410 but will not attach to the non-plated section 408. In this example, the lid 402 includes a port 412 making the example of FIG. 4 a top port device. In other examples, the port is on the bottom (i.e., through the base 404) making the assembly 400 a bottom port device.

Since the metal can 402 is not fully plated, control of the solder (or some other conductive fusion material) that can potentially creep up or flow across the metal can 402 is achieved. Unwanted joint material (e.g., solder) is prevented from entering areas or volumes that are to be kept free of this unwanted material thereby preventing damage to internal components of microphones or other acoustic devices. In this example, the solder will not move further up the can than the level indicated by the line labeled 414. In one example, the plated area is approximately ¼ to ⅓ the total height of the metal can and the can is approximately 1 mm high. Other dimensions are possible.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An acoustic device, the device comprising:
a substrate;
a substrate cover disposed on the substrate, the substrate and the substrate cover being physically separate from one another, the substrate cover including a core constructed of a base metal and having an interior surface and an exterior surface, wherein the substrate cover includes a first partial metal plating and a second partial metal plating, the first partial metal plating affixed to the interior surface and covering only a portion of the interior surface and the second partial metal plating affixed to the exterior surface and covering only a portion of the exterior surface, the first partial metal plating and the second partial metal plating being immediately adjacent to the substrate such that solder coupling the substrate to the substrate cover communicates with the substrate, the first partial metal plating and the second partial metal plating; and
a plurality of electrical and acoustic components disposed on the substrate and under the substrate cover,
wherein the first partial metal plating and the second partial metal plating are arranged so as to prevent solder creep along a surface of the substrate cover.

2. The acoustic device of claim 1, wherein the base metal is brass.

3. The acoustic device of claim 1, wherein at least one of the first partial metal plating and the second partial metal plating is gold.

4. The acoustic device of claim 1, wherein the base metal is stainless steel.

5. The acoustic device of claim 1, wherein at least one of the first partial metal plating and the second partial metal plating is effective to prevent solder creep to a predetermined height of the substrate cover.

6. The acoustic device of claim 1, wherein the portion of the interior surface is approximately ¼ to ⅓ of the interior surface and the portion of the exterior surface is approximately ¼ to ⅓ of the exterior surface.

7. The acoustic device of claim 1, wherein at least one of the first partial metal plating and the second partial metal plating is nickel.

8. A cover for an acoustic device, the cover comprising:
   a core constructed of a base metal, wherein the core includes an exterior surface and an interior surface;
   a first metal plating disposed over a portion of the exterior surface, the first metal plating arranged so as to prevent solder creep along the exterior surface of the cover;
   a second metal plating disposed over a portion of the interior surface, the second metal plating arranged so as to prevent solder creep along the interior surface of the cover; and
   a first non-plated surface over a remaining portion of the exterior surface of the cover,
   wherein the cover is configured for attachment to a substrate of the acoustic device, and
   wherein the first non-plated surface does not attach to a solder.

9. The cover of claim 8, wherein the base metal is brass.

10. The cover of claim 8, wherein at least one of the first metal plating and the second metal plating is gold.

11. The cover of claim 8, wherein the base metal is stainless steel.

12. The cover of claim 8, wherein the first metal plating is effective to prevent solder creep to a predetermined height of the exterior surface and the second metal plating is effective to prevent solder creep to a predetermined height of the interior surface.

13. The cover of claim 8, wherein the portion of the interior surface is approximately ¼ to ⅓ of the interior surface and the portion of the exterior surface is approximately ¼ to ⅓ of the exterior surface.

14. The cover of claim 8, wherein at least one of the first metal plating and the second metal plating is nickel.

15. The cover of claim 8, further comprising a second non-plated surface over a remaining portion of the interior surface of the cover, wherein the second non-plated surface does not attach to the solder.

* * * * *